United States Patent
Holland (10) Patent No.: US 8,610,273 B2
(45) Date of Patent: Dec. 17, 2013

(54) WAFER LEVEL CHIP SCALE PACKAGE WITHOUT AN ENCAPSULATED VIA

(75) Inventor: Andrew Holland, Cambridge (GB)

(73) Assignee: Cambridge Silicon Radio Ltd., Cambridge (GB)

( * ) Notice: Subject to any disclaimer, the term of this patent is extended or adjusted under 35 U.S.C. 154(b) by 226 days.

(21) Appl. No.: 13/124,712

(22) PCT Filed: Sep. 14, 2009

(86) PCT No.: PCT/GB2009/051187
§ 371 (c)(1),
(2), (4) Date: Apr. 18, 2011

(87) PCT Pub. No.: WO2010/046674
PCT Pub. Date: Apr. 29, 2010

(65) Prior Publication Data
US 2011/0198753 A1 Aug. 18, 2011

(30) Foreign Application Priority Data
Oct. 22, 2008 (GB) .................................. 0819351.8

(51) Int. Cl.
*H01L 29/40* (2006.01)
(52) U.S. Cl.
USPC ............ 257/738; 257/E23.068; 257/E23.069; 257/E21.508
(58) Field of Classification Search
USPC .................. 257/738, 737, E23.068, E23.069, 257/E21.508
See application file for complete search history.

(56) References Cited

U.S. PATENT DOCUMENTS

| 5,834,844 | A | * | 11/1998 | Akagawa et al. | 257/734 |
| 6,437,432 | B2 | * | 8/2002 | Ikumo et al. | 257/691 |
| 6,521,970 | B1 | * | 2/2003 | Takiar et al. | 257/522 |
| 6,822,317 | B1 | | 11/2004 | Inoue et al. | |
| 7,019,410 | B1 | | 3/2006 | Jiang | |
| 2001/0045649 | A1 | | 11/2001 | Sumikawa et al. | |
| 2002/0008320 | A1 | | 1/2002 | Kuwabara et al. | |
| 2004/0087130 | A1 | | 5/2004 | Kazama et al. | |
| 2004/0137660 | A1 | | 7/2004 | Murata | |
| 2005/0037539 | A1 | | 2/2005 | Suzuki et al. | |
| 2005/0040523 | A1 | | 2/2005 | Hanaoka | |

(Continued)

FOREIGN PATENT DOCUMENTS

CN 1913139 A 2/2007

OTHER PUBLICATIONS

Abbreviated Examination Report under Section 18(3) for British Patent Application No. GB0819351.8 mailed Jun. 13, 2012.

(Continued)

*Primary Examiner* — Marcos D. Pizarro
*Assistant Examiner* — Bilkis Jahan
(74) *Attorney, Agent, or Firm* — Frommer Lawrence & Haug LLP; John W. Branch (57) ABSTRACT

An improved wafer level chip scale packaging technique is described which does not use an encapsulated via to connect between a redirection layer and a pad within the pad ring on the semiconductor die. In an embodiment, a first dielectric layer is formed such that it terminates on each die within the die's pad ring. Tracks are then formed in a conductive layer which contact one of the pads and run over the edge of an opening onto the surface of the first dielectric layer. These tracks may be used to form an electrical connection between the pad and a solder ball.

8 Claims, 7 Drawing Sheets

(56) References Cited

U.S. PATENT DOCUMENTS

2005/0194687 A1    9/2005   Yamaguchi
2005/0266671 A1   12/2005   Aoyagi
2006/0125117 A1    6/2006   Hashimoto
2006/0237836 A1   10/2006   Fjelstad et al.
2007/0035000 A1    2/2007   Hashimoto

OTHER PUBLICATIONS

WIPO, International Preliminary Report on Patentability of PCT Application No. PCT/GB2009/051187, Apr. 26, 2011, 6 pages.

Search Report issued on Dec. 19, 2012 in corresponding Chinese Patent Application No. 200980142314.2.

* cited by examiner

Prior art

FIG. 1

Prior art

WAFER LEVEL CHIP SCALE PACKAGE WITHOUT AN ENCAPSULATED VIA

BACKGROUND

Advances in techniques for packaging semiconductor die are being driven by the market for smaller, lower cost electronic devices with increasing functionality. Chip scale packaging (CSP) encompasses a number of different packaging techniques where the size of the packaged die is only slightly larger than the size of the die itself (e.g. a ratio of areas which does not exceed 1.2:1). In one example of CSP, the die may be mounted onto a package on which solder balls (or bumps) are formed (e.g. a ball grid array package), such that the die is electrically connected to the package by means of wirebonds and the assembled package may be mounted onto a printed circuit board (PCB) using BGA techniques or flip-chip bonding.

In wafer level chip scale packaging (WLCSP), also referred to as wafer level packaging, the solder balls (or bumps) are formed directly on the semiconductor wafer, before the wafer is diced into individual die. This results in a very compact packaged die and enables wafer scale testing of packaged die, which may have cost and efficiency benefits.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

An improved wafer level chip scale packaging technique is described which does not use an encapsulated via to connect between a redirection layer and a pad within the pad ring on the semiconductor die. In an embodiment, a first dielectric layer is formed such that it terminates on each die within the die's pad ring. Tracks are then formed in a conductive layer which contact one of the pads and run over the edge of an opening onto the surface of the first dielectric layer. These tracks may be used to form an electrical connection between the pad and a solder ball.

A first aspect provides packaged semiconductor device comprising: a semiconductor die comprising a plurality of pads arranged around the periphery of an active face of the die; a first dielectric layer formed on the active face, wherein the first dielectric layer is terminated within the plurality of pads around the periphery of the active face of the die; a plurality of tracks formed in a conductive layer, wherein each track is connected to one of the plurality of pads and comprises an upper portion which is formed on the first dielectric layer; a second dielectric layer arranged to encapsulate the active face; and a plurality of solder elements, each of the solder elements being electrically connected to an upper portion of a track.

Each track may be formed over a termination of the first dielectric layer.

Each track may be directly connected to one of the plurality of pads.

The second dielectric layer may be terminated outside of the periphery of the active face of the die.

The device may be a wafer level chip scale packaged device.

A second aspect provides a method of fabricating a packaged semiconductor device comprising: forming a first dielectric layer on an active face of a semiconductor wafer comprising an array of semiconductor die, wherein each semiconductor die comprises a plurality of pads arranged around the periphery of an active face of the die and the first dielectric layer is terminated on each die within the plurality of pads around the periphery of the active face of the die; forming a plurality of tracks in a conductive layer on the active face and the first dielectric layer, wherein each track on a die comprises a lower portion formed on one of the plurality of pads and an upper portion which is formed on the first dielectric layer; forming a second dielectric layer over each semiconductor die; forming a plurality of solder elements, each of the solder elements being electrically connected to an upper portion of a track; and dicing the semiconductor wafer into a plurality of packaged semiconductor devices.

Each track may comprise a centre portion which is formed over a termination of the first dielectric layer.

Each track may comprise a further portion, between the lower portion and the centre portion, the further portion being formed on the active surface of the die.

Forming a first dielectric layer on an active face of a semiconductor wafer may comprise: depositing a first dielectric layer on the active face of a semiconductor wafer; and selectively etching the first dielectric layer to terminate the first dielectric layer on each die within the plurality of pads around the periphery of the active face of the die.

The device may be a wafer level chip scale packaged device.

A third aspect provides a packaged semiconductor device substantially as described with reference to any of FIGS. 3-4 and 6-7 of the drawings.

A fourth aspect provides a method of fabricating a packaged semiconductor device substantially as described with reference to FIG. 5 of the drawings.

The preferred features may be combined as appropriate, as would be apparent to a skilled person, and may be combined with any of the aspects of the invention.

BRIEF DESCRIPTION OF THE DRAWINGS

Embodiments of the invention will be described, by way of example, with reference to the following drawings, in which.

Common reference numerals are used throughout the figures to indicate similar features and it will be appreciated that layers and layouts shown in these figures are by way of example only and are not drawn to scale.

DETAILED DESCRIPTION

Embodiments of the present invention are described below by way of example only. These examples represent the best ways of putting the invention into practice that are currently known to the Applicant although they are not the only ways in which this could be achieved. The description sets forth the functions of the example and the sequence of steps for constructing and operating the example. However, the same or equivalent functions and sequences may be accomplished by different examples.

Figure 1:
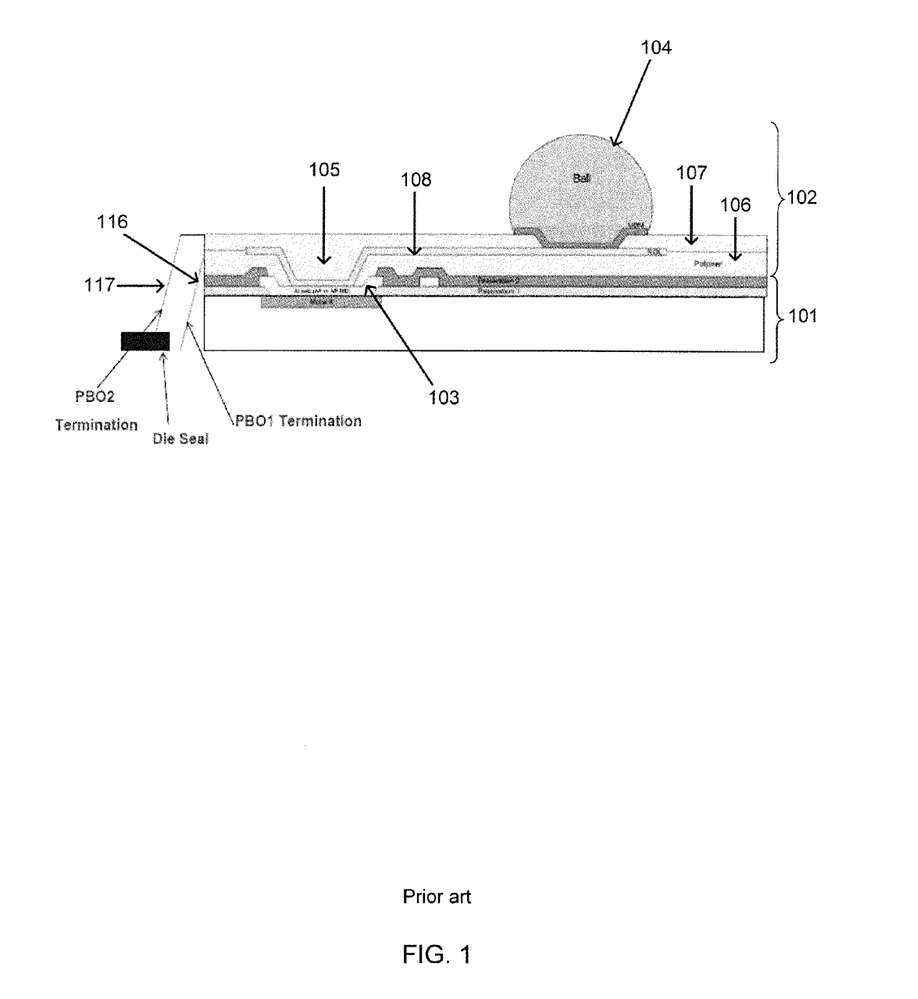
FIGS. 1 and 2 show a cross-section and a plan view through a WLCSP device fabricated using known techniques.
Figure 2:
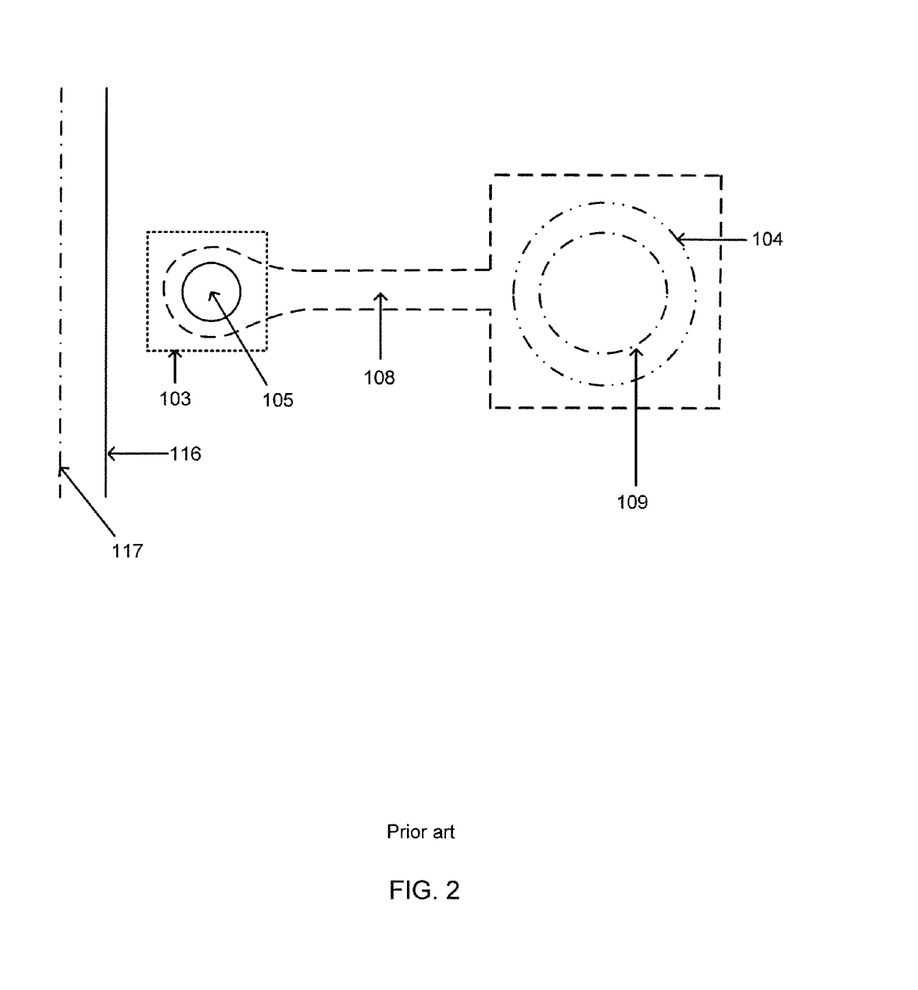

An example of a known method of wafer level chip scale packaging is shown in FIGS. 1 and 2. FIG. 1 shows a cross-section through a WLCSP which comprises a semiconductor die 101 which has been further processed through the addition of a number of layers of material 102 onto the active face of the die. It will be appreciated that for purposes of clarity, not all layers have been shown within the semiconductor die 101. In order to provide an electrical connection between a pad 103 on the die and the solder ball 104, an encapsulated via 105 in a lower of two polymer layers 106, 107 is used. FIG. 2 is a corresponding plan view showing the pad 103, the via 105 through the lower polymer layer 106 and the track 108 connecting the pad 103 to the solder ball 104. FIG. 2 also shows the via 109 in the upper polymer layer 107 which provides the electrical connection between the track 108 and the solder ball 104. The terminations 116, 117 of the two polymer layers 106, 107 at the edge of the die are also shown.

In such known WLCSPs, the pitch of the pads 103 on the die is limited by the minimum size of the encapsulated via 105 which can be reliably fabricated. In an example, the minimum size of hole etched in the polymer layer is 30 μm diameter and this requires an area of metal (referred to as a capture pad), in the metal layer 108 above the polymer layer, with a minimum size of 61 μm diameter. If the minimum spacing between areas of metal is 19 μm, this sets a minimum pad pitch of 80 μm.

The embodiments described below are not limited to implementations which solve any or all of the disadvantages of known wafer level chip scale packages and packaging techniques.

Figure 3:
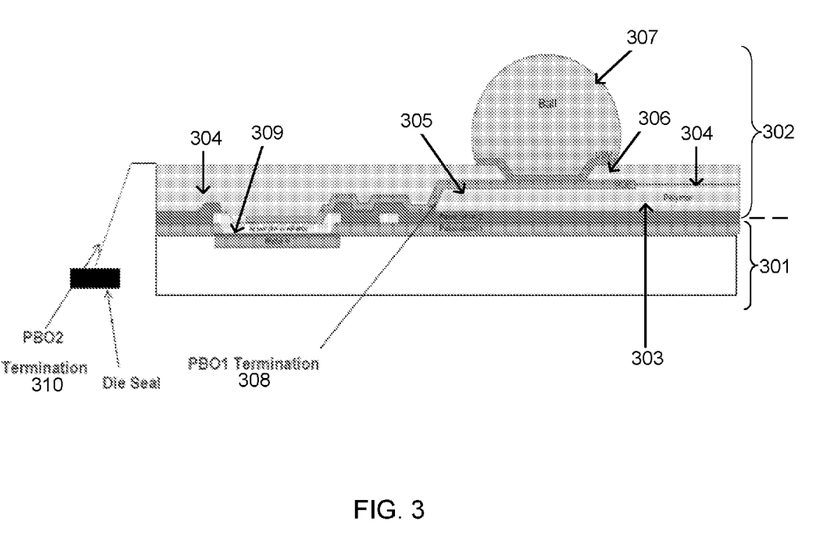
FIG. 3 shows a cross-section through an example of an improved WLCSP.

FIG. 3 shows a cross-section through an example of an improved WLCSP which does not use an encapsulated via. The improved WLCSP comprises a semiconductor die 301 which has been additionally processed (at a wafer scale) to add a number of additional layers 302 onto the active face of the die. The semiconductor die 301 is fabricated by depositing materials onto one face of a semiconductor wafer, typically a silicon wafer. The wafer, and hence each die, has an active face, which is the face on which metal tracks and other circuitry have been formed and an inactive face, which is the substrate itself. The additional layers 302 may comprise one or more dielectric layers (e.g. dielectric layers 303, 304), one or more metal layers (e.g. redistribution layer 305, under bump metal 306 and solder, e.g. solder ball 307). It will be appreciated that to improve clarity, not all the layers of the semiconductor die 301 have been shown. Furthermore, other examples may include additional WLCSP layers not shown in FIG. 3.

As shown in FIG. 3, the lower dielectric layer 303 is terminated (as indicated by arrow 308) away from the edge of the die and within the die's pad ring. The term 'pad ring' is used herein to refer to the die's peripheral pads which may form a ring around the periphery of the die or there may be pads along only a part of the periphery of a die. Where there are not pads around the entire periphery, the lower dielectric layer may be terminated within the pads on the die's periphery, but in regions of the periphery where there are no pads, the lower dielectric layer may extend closer to the edge of the die and in some examples may extend beyond the edge of the die. The termination of the lower dielectric layer 303 may be achieved using any suitable method, e.g. by deposition, patterning and etching. The redistribution layer 305 is deposited over the edge of the dielectric layer 303 in order to provide an electrical connection between a pad 309 on the die 301 and the solder ball 307. The upper dielectric layer 304 is terminated at or beyond the edge of the die in order to encapsulate the die and preventing regression of moisture.

Figure 4:
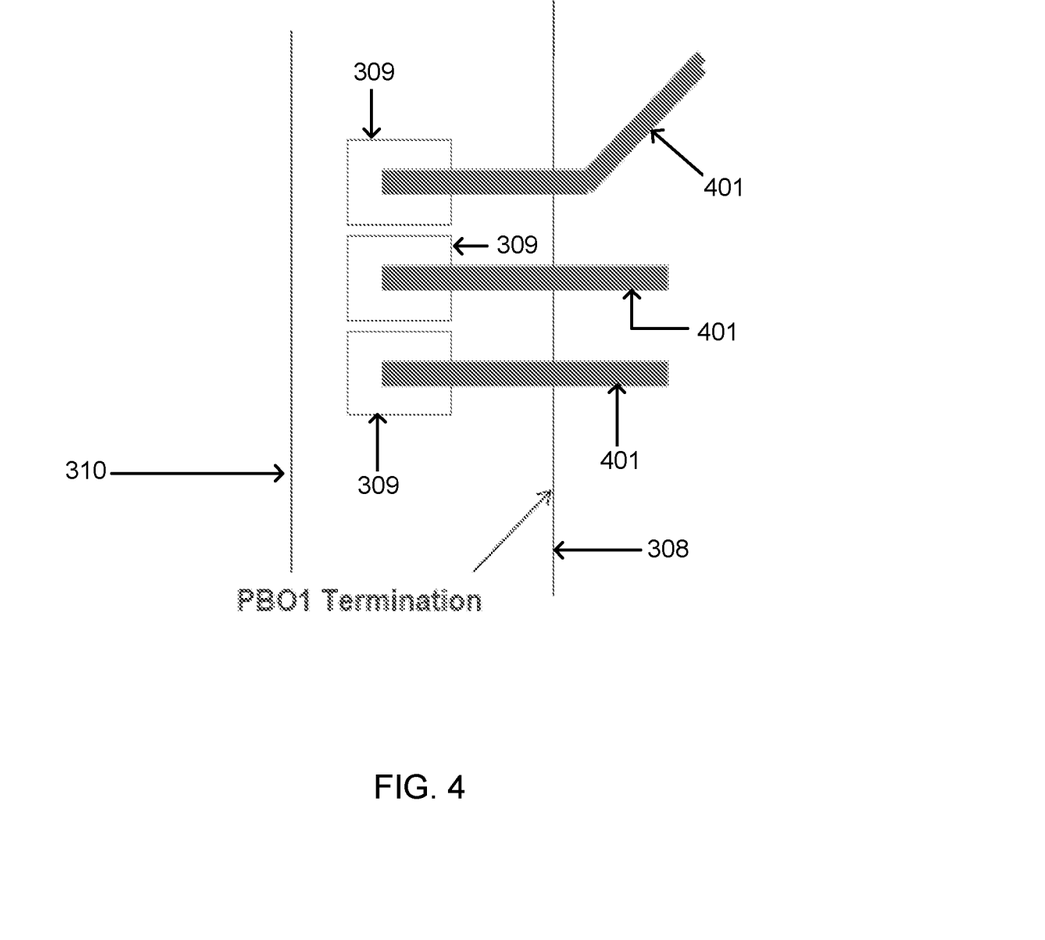
FIG. 4 shows a plan view of another example of an improved WLCSP.

The termination 308 of the lower dielectric layer 303 is also shown in FIG. 4 which is a plan view of another example of an improved WLCSP. For purposes of clarity, only a few layers are shown in FIG. 4. The example in FIG. 4 shows three pads 309 on the die and three tracks 401 formed in the redistribution layer 305. These tracks may be formed using any suitable technique (e.g. deposition following by etching or using a lift-off process in which the deposition occurs after patterning of a resist layer on the wafer). The lower dielectric layer 303 is terminated 308 within the die's pad ring (where pads 309 shown are a subset of the pad ring) and the termination 310 of the upper dielectric layer 304 is also shown. In an example, the separation between the positions at which the two dielectrics are terminated may be of the order of 200 μm or greater. There is no encapsulated via between the tracks 401 in the routing layer 305 and the pads 309, but instead the tracks run over the edge of the lower dielectric layer 303 and onto the pads 309 themselves.

It will be appreciated that the arrangement shown in FIG. 4 is by way of example only. Other examples may have different geometries, e.g. the tracks and the pads may be of substantially the same width, the pads may be round rather than rectangular etc.

Using the technique described above and shown in FIGS. 3 and 4, the minimum allowed pitch of the pads on the semiconductor die is reduced. Using the same process constraints as detailed in the example above, the new minimum pad pitch is set by the minimum spacing between areas of metal (e.g. 19 μm) and the minimum track width (e.g. 25 μm) which can be achieved by the semiconductor die fabrication process (in order to fabricate pads 309) and by the WLCSP process (in order to fabricate tracks 401). In this example, the minimum pitch is reduced to 44 μm, although there may be other constraints, separate from WLCSP, which limit the minimum pitch which is actually used (e.g. the minimum pitch for wirebond pads which is currently 55 μm) and pitches which exceed the minimum may be used. The removal of the constraint on pad pitch due to the WLCSP process enables a die to be designed which is suitable for wirebonding and/or WLCSP without increasing die size. Depending upon the specific implementation, the reduction in the minimum permitted pitch of pads on the die may enable a reduction in the overall size of the die, which may also reduce the manufacturing cost of the die (e.g. where the per wafer cost is fixed). In addition, or instead, the reduction in the minimum permitted pad pitch may enable more pads (i.e. more I/Os) along the edge of a die.

The technique described above (and shown in FIGS. 3 and 4) may also improve the yield of packaged die because of a reduction in the number of dielectric layers which are terminated in or near the scribe lanes between die. In an example, by terminating the lower dielectric layer within the die area, the upper dielectric can be terminated further from the centre of the scribe lane. This increased separation between the path of a wafer dicing blade and the edge of the upper dielectric layer reduces the likelihood that the dielectric layer may be damaged by the dicing process and therefore increases the yield of the WLCSP process.

Figure 5:
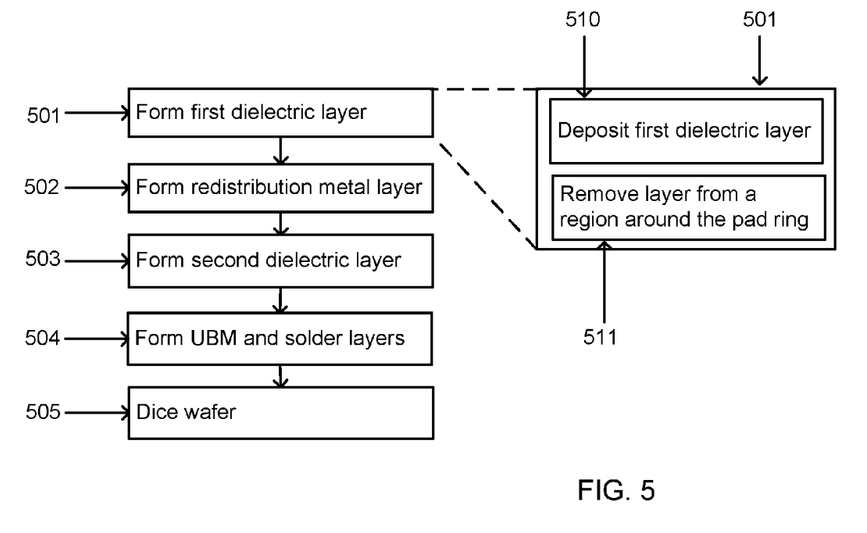
FIG. 5 shows a flow diagram of an example method of fabricating a packaged semiconductor die using an improved WLCSP process.

FIG. 5 shows a method of fabricating a packaged semiconductor die using an improved WLCSP process. The process involves forming a first dielectric layer on a semiconductor wafer comprising an array of semiconductor die (block 501), where the first dielectric layer comprises openings (also referred to as apertures or holes) around the pad rings of each die which are free from the first dielectric, such that the first dielectric layer is terminated on each die within the pad ring. These openings are larger than a single pad from the pad ring and each opening encompasses more than one pad from the pad ring. In an example implementation, the first dielectric layer may be formed by deposition of a complete layer over the wafer (block 510), followed by selective removal of regions around the pad ring (block 511), e.g. by patterning the layer using photolithography and etching away the layer in defined regions. In another example implementation, the first dielectric layer may be formed using a printing process (e.g. using screen printing) which defines the openings in the dielectric layer.

Having formed the patterned first dielectric layer (in block 501), a redistribution layer is deposited or otherwise formed (block 502). The distribution layer comprises tracks which run over the edge of the first dielectric layer and onto the pads within the pad ring, and again these tracks may be formed by deposition followed by etching or by an alternative process. Additional layers may subsequently be formed, such as a second dielectric layer (block 503) followed by under bump metallization (UBM) and solder (block 504). Having completed the wafer scale processing, the wafer is divided into the individual packaged die (block 505), e.g. using a wafer dicing saw.

In an example implementation, a standard WLCSP process and standard WLCSP materials may be used with the improvement that the design of the first dielectric layer is changed such that it is terminated within the pad ring. In other examples, the WLCSP process and/or materials may also be modified.

It will be appreciated that the method shown in FIG. 5 may comprise additional steps (e.g. additional redistribution and polymer layers) and/or alternative steps. Any suitable semiconductor processing technique may be used for the forming of any of the layers and any suitable material may be used for each layer. In an example, the dielectric layer may be benzocyclobutene (BCB), polybenzoxazole (PBO), polyimide (PI) or another polymer. It will be appreciated that any references to PBO in FIGS. 3 and 4 are by way of example only, and other materials, such as BCB, PI, other polymers or other dielectrics, may alternatively be used for either of the dielectric layers.

Figure 6:
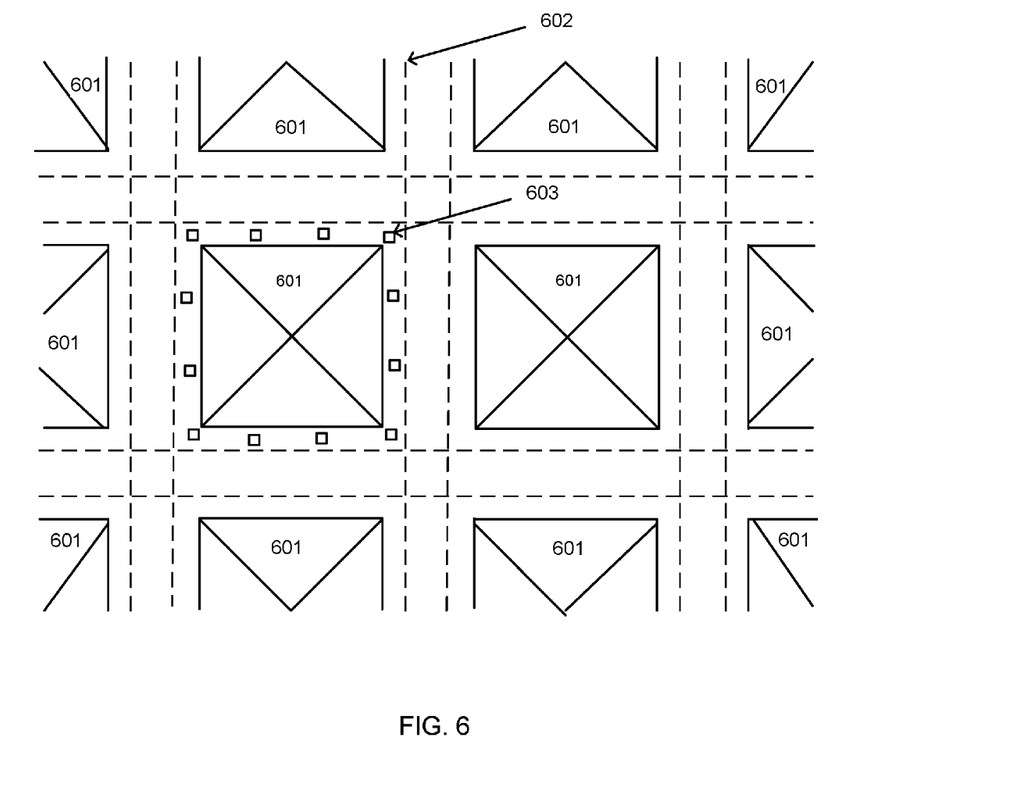
FIGS. 6 and 7 show examples of patterned dielectric layers.
Figure 7:
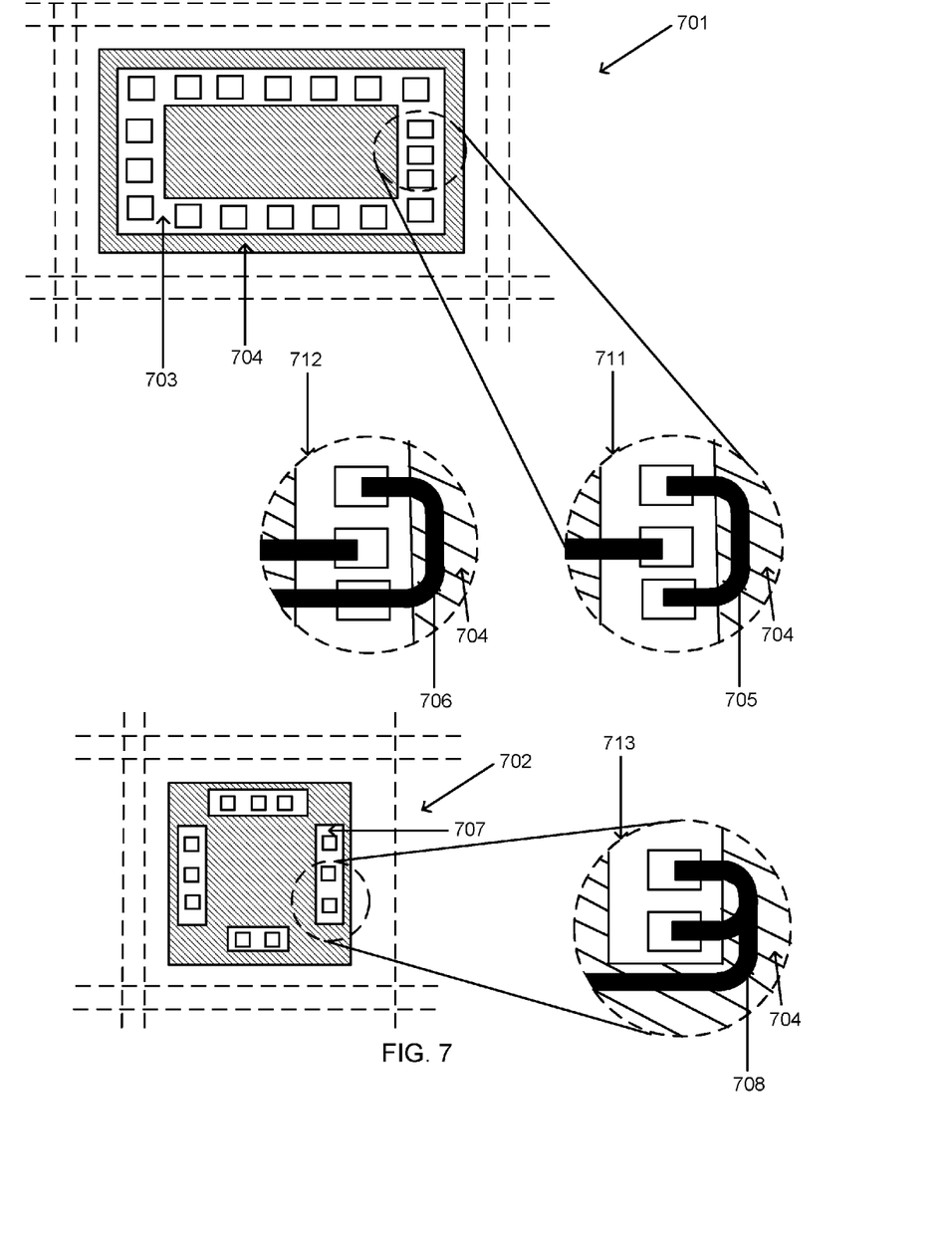

FIG. 6 shows one example of a patterned dielectric layer 601 which comprises openings around the pad ring such that it does not cover regions around the pad ring of a semiconductor die and such that the dielectric layer is terminated within the pad ring on each die. In FIG. 6 the dielectric layer 601 is shown shaded, the edges of individual die are indicated by dotted lines 602 and the position of the pad ring 603 on one of the die is shown. Two further examples 701, 702 are shown in FIG. 7 with the areas where the dielectric layer is present being shown shaded and the openings being unshaded. In a first example, 701, the first dielectric layer is terminated within the pad ring and there is a region 703 in the area of the pad ring is clear of the dielectric layer. In this example there is also a further region of dielectric layer 704 between the pad ring and the edge of a die. As shown in the two example expanded views 711, 712, this further region of dielectric layer 704 enables tracks (e.g. track 705) in a redistribution layer to be routed between the pad ring and the edge of the die and in some examples (e.g. track 706) the track may connect a number of pads and then continue inbound on the die. Whilst such tracks could be routed below the dielectric layer (e.g. in the Aluminium Pad (AP) layer), in some applications this may not be possible (e.g. as it would cause electrical shorts or because the layer is used for another purpose such as a ground layer) or may be problematic (e.g. due to cross-talk between tracks in closely spaced layers). In a second example, 702, regions 707 around groups of pads within the pad ring are clear of the dielectric layer. In a similar manner to the first example, tracks (e.g. track 708) may be routed between the pad ring and the die in some examples (e.g. as shown the third example expanded view 713).

The techniques described above with reference to FIGS. 3-7 may be used in combination with other techniques for reducing the pitch of pads in the pad ring of a die. Examples of these other techniques include using the pad layer on the semiconductor die (e.g. the AP layer) to do additional routing, for example to connect pads within the pad ring to further pads which are arranged on a larger pitch (e.g. to create a double pad ring with pads in the inner and outer rings spaced more widely than the peripheral pad ring), or using an additional redirection layer and dielectric layer to enable routing in a redirection layer.

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to an item refers to one or more of those items. The term 'comprising' is used herein to mean including the method blocks or elements identified, but that such blocks or elements do not comprise and exclusive list and a method or apparatus may contain additional blocks or elements.

The steps of the methods described herein may be carried out in any suitable order, or simultaneously where appropriate. Additionally, individual blocks may be deleted from any of the methods without departing from the spirit and scope of the subject matter described herein. Aspects of any of the examples described above may be combined with aspects of any of the other examples described to form further examples without losing the effect sought.

It will be understood that the above description of a preferred embodiment is given by way of example only and that various modifications may be made by those skilled in the art. Although various embodiments have been described above with a certain degree of particularity, or with reference to one or more individual embodiments, those skilled in the art could make numerous alterations to the disclosed embodiments without departing from the spirit or scope of this invention.

The invention claimed is:

1. A packaged semiconductor device comprising:
    a semiconductor die comprising a plurality of pads arranged in a pad ring around the periphery of the die on an active face of the die; and
    a first dielectric layer formed on the active face, wherein the first dielectric layer comprises a first region terminated within the pad ring and a further region between the pad ring and an edge of the die, such that an area around the pad ring is clear of the first dielectric layer;
    a plurality of tracks formed in a conductive layer, wherein each track is connected to one of the plurality of pads and comprises an upper portion which is formed on the first dielectric layer and wherein at least one of the plurality of tracks comprises an upper portion which is formed on the further region of the first dielectric layer;
    a second dielectric layer arranged to encapsulate the active face; and
    a plurality of solder elements, each of the solder elements being electrically connected to an upper portion of a track.

2. The packaged semiconductor device according to claim 1, wherein each track is formed over a termination of the first dielectric layer.

3. The packaged semiconductor device according to claim 1, wherein the second dielectric layer is terminated outside of the periphery of the active face of the die.

4. The packaged semiconductor device according to claim 1, wherein the device is a wafer level chip scale packaged device.

5. The packaged semiconductor device according to claim 1, wherein each track is directly connected to one or more of the plurality of pads.

6. The packaged semiconductor device according to claim 5, wherein each track is terminated within an area of the one of the plurality of pads to which it is directly connected.

7. The packaged semiconductor device according to claim 1, wherein at least one of the plurality of tracks connects more than one pad together and comprises an upper portion which is formed on the further region of the first dielectric layer.

8. The packaged semiconductor device according to claim 7, wherein the at least one of the plurality of tracks further comprises a second upper portion formed on the first region of the first dielectric layer.

* * * * *

UNITED STATES PATENT AND TRADEMARK OFFICE
CERTIFICATE OF CORRECTION

PATENT NO.         : 8,610,273 B2
APPLICATION NO.    : 13/124712
DATED              : December 17, 2013
INVENTOR(S)        : Andrew Holland Page 1 of 1

It is certified that error appears in the above-identified patent and that said Letters Patent is hereby corrected as shown below:

In the Specification

In Column 3, Line 67, delete "preventingression" and insert -- prevent ingression --, therefor.

In Column 6, Line 25, delete "an item" and insert -- 'an' item --, therefor.

Signed and Sealed this
Thirteenth Day of May, 2014

Michelle K. Lee
*Deputy Director of the United States Patent and Trademark Office*